US000001396H

United States Statutory Invention Registration [19]

[11] Reg. Number: H1396

[43] Published: Jan. 3, 1995

Vig et al.

[54] OXIDE SUBSTRATE WITH A STRONGLY ADHERENT GOLD FILM OF 10 TO 40 NM IN THICKNESS ON THE SUBSTRATE

[75] Inventors: John R. Vig, Colts Neck; Mary A. Hendrickson, Forked River; Sally M. Laffey, So. Bend Brook, all of N.J.

[73] Assignee: The United States of America as represented by the Secretary of the Army, Washington, D.C.

[21] Appl. No.: 125,050

[22] Filed: Sep. 21, 1993

[51] Int. Cl.[6] ..... B32B 15/00

[52] U.S. Cl. ..... 428/434; 428/450; 428/472.2

[58] Field of Search ..... 428/336, 434, 469, 472, 428/689, 699, 702

[56] References Cited

U.S. PATENT DOCUMENTS

| | | | |
|---|---|---|---|
| 3,653,946 | 4/1972 | Fefferman | 427/229 |
| 3,833,410 | 9/1974 | Ang | 428/434 |
| 4,005,229 | 1/1977 | Miller | 427/304 |
| 4,028,080 | 6/1977 | Divita et al. | 65/2 |
| 4,309,460 | 1/1982 | Singh | 427/250 |
| 4,457,972 | 7/1984 | Griffith | 428/434 |
| 4,888,204 | 12/1989 | Tutt | 427/555 |
| 4,933,204 | 6/1990 | Warren, Jr. | 427/555 |
| 4,959,257 | 9/1990 | Mukherjee | 428/434 |
| 5,139,856 | 8/1992 | Takeuchi | 428/434 |
| 5,288,558 | 2/1994 | Nöthe | 428/434 |

*Primary Examiner*—Robert L. Stoll
*Assistant Examiner*—Joseph D. Anthony
*Attorney, Agent, or Firm*—Michael Zelenka; Roy E. Gordon

[57] ABSTRACT

An adherent gold film is deposited onto an oxide substrate by cleaning the oxide surface so as to remove all contaminants and then vacuum depositing onto the clean oxide surface a gold film of up to 40 nm in thickness.

6 Claims, No Drawings

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

OXIDE SUBSTRATE WITH A STRONGLY ADHERENT GOLD FILM OF 10 TO 40 NM IN THICKNESS ON THE SUBSTRATE

GOVERNMENT INTEREST

The invention described herein may be manufactured, used, and licensed by or for the Government for governmental purposes without the payment to us of any royalties thereon.

FIELD OF INVENTION

The invention relates in general to the art of coating an oxide surface or substrate with a gold film and in particular to a method of depositing a strongly adhering gold film onto a quartz substrate and to the gold film so deposited.

BACKGROUND OF THE INVENTION

It has been well known that gold films do not adhere to oxide surfaces, such as quartz. For example, the generally accepted criterion for adhesion between a metal film and an oxide surface or substrate has been that the metal must be oxygen active so as to react chemically with the oxide surface. Since gold does not form a stable oxide under normal conditions, having a heat of oxide formation of +19 kcal/mol it, supposedly, does not adhere to oxide surfaces as, for example, quartz. Adhesion layers, such as chromium or titanium are often used as adhesion layers between the oxide and the gold. In some cases, however, it would be highly desirable to not have to use an intermediate layer.

SUMMARY OF THE INVENTION

The general object of this invention is to provide a gold film that will strongly adhere to an oxide surface. A more particular object of the invention is to provide such a gold film without an intermediate adhesion layer. A particular object of the invention is to provide such a gold film for a quartz surface or substrate.

It has now been found that an adherent gold film can be deposited on an oxide surface or substrate by cleaning the oxide surface so as to remove all organic contaminants and then vacuum depositing onto the clean oxide surface a gold film of up to 40 nanometers in thickness.

Gold films of thickness 10 nm, 20 nm and 30 nm adhere strongly, whereas films of greater than 40 nm thickness adhere very weakly. In this connection, the Scotch tape test readily removes the thicker films but not the thinner ones.

DESCRIPTION OF THE PREFERRED EMBODIMENT

The surface of a quartz substrate is first cleaned and all organic contaminants removed by standard UV-ozone technique such as described in U.S. Pat. No. 4,028,135 by Vig et al.

The cleaned quartz substrate is placed into an ultra-high vacuum system. A gold film is then vacuum deposited by a clean deposition method such as thermal evaporation or electron beam deposition. The thickness of the film is in the range of 10 to 30 nanometers.

The film adheres very strongly as evidenced by the fact that it cannot be removed by the Scotch tape test, or by ultrasonic agitation in water, alcohol or acetone, or by mechanical abrasion with objects such as clean-room wipes, sponge tips and wooden sticks. In lieu of quartz one can use any substrate with an oxide surface, such as silicon wafers, glass and aluminum oxide.

We wish it to be understood that we do not desire to be limited to the exact details of construction shown and described for obvious modifications will occur to a person skilled in the art.

What is claimed is:

1. An oxide substrate with a strongly adherent gold film of 10 to 40 nm in thickness on the substrate.

2. An oxide substrate according to claim 1 wherein the oxide substrate is selected from the group consisting of a quartz substrate, a silicon wafer, a glass substrate and aluminum oxide.

3. An oxide substrate according to claim 2 wherein the oxide substrate is quartz.

4. An oxide substrate according to claim 2 wherein the oxide substrate is a silicon wafer.

5. An oxide substrate according to claim 2 wherein the oxide substrate is a glass substrate.

6. An oxide substrate according to claim 2 wherein the oxide substrate is aluminum oxide.

* * * * *